United States Patent
Jimenez Martinez

(10) Patent No.: US 11,830,776 B2
(45) Date of Patent: Nov. 28, 2023

(54) METHOD FOR MANUFACTURING AN INTEGRATED CIRCUIT COMPRISING A JUNCTION FIELD EFFECT TRANSISTOR (JFET)

(71) Applicant: STMicroelectronics (Crolles 2) SAS, Crolles (FR)

(72) Inventor: Jean Jimenez Martinez, Salles d'Aude (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/730,691

(22) Filed: Apr. 27, 2022

(65) Prior Publication Data

US 2022/0254905 A1    Aug. 11, 2022

Related U.S. Application Data

(62) Division of application No. 17/095,230, filed on Nov. 11, 2020, now Pat. No. 11,342,449.

(30) Foreign Application Priority Data

Nov. 15, 2019    (FR) ...................................... 1912782

(51) Int. Cl.
*H01L 21/82*        (2006.01)
*H01L 21/8248*      (2006.01)
(Continued)

(52) U.S. Cl.
CPC ........ *H01L 21/8248* (2013.01); *H01L 21/046* (2013.01); *H01L 21/0415* (2013.01);
(Continued)

(58) Field of Classification Search
CPC ... H01L 21/0415; H01L 21/046; H01L 21/62; H01L 29/0653; H01L 21/8248;
(Continued)

(56) References Cited

U.S. PATENT DOCUMENTS 8,754,455 B2    6/2014  Liu et al.
2008/0272404 A1  11/2008  Kapoor
(Continued)

OTHER PUBLICATIONS

INPI Search Report and Written Opinion for FR 1912782 dated Jun. 22, 2020 (9 pages).

(Continued)

*Primary Examiner* — Shouxiang Hu
(74) *Attorney, Agent, or Firm* — CROWE & DUNLEVY

(57) ABSTRACT

An integrated circuit includes a junction field-effect transistor formed in a semiconductor substrate. The junction field-effect transistor includes a drain region, a source region, a channel region, and a gate region. A first isolating region separates the drain region from both the gate region and the channel region. A first connection region connects the drain region to the channel region by passing underneath the first isolating region in the semiconductor substrate. A second isolating region separates the source region from both the gate region and the channel region. A second connection region connects the source region to the channel region by passing underneath the second isolating region in the semiconductor substrate.

20 Claims, 3 Drawing Sheets

(51) Int. Cl.
  *H01L 27/06* (2006.01)
  *H01L 29/06* (2006.01)
  *H01L 29/66* (2006.01)
  *H01L 29/808* (2006.01)
  *H01L 29/423* (2006.01)
  *H10B 20/00* (2023.01)
  *H01L 21/62* (2006.01)
  *H01L 21/04* (2006.01)

(52) U.S. Cl.
  CPC .......... *H01L 21/62* (2013.01); *H01L 27/0623* (2013.01); *H01L 29/0653* (2013.01); *H01L 29/42376* (2013.01); *H01L 29/66893* (2013.01); *H01L 29/808* (2013.01); *H10B 20/40* (2023.02)

(58) Field of Classification Search
  CPC ........... H01L 27/0623; H01L 29/66893; H01L 29/808; H01L 29/732; H01L 29/66901; H01L 29/42376; H01L 27/11273
  See application file for complete search history.

(56) References Cited

U.S. PATENT DOCUMENTS

| | | |
|---|---|---|
| 2008/0272406 A1 | 11/2008 | Banna |
| 2009/0101941 A1 | 4/2009 | Ellis-Monaghan et al. |
| 2010/0032731 A1* | 2/2010 | Babcock ............... H01L 29/812 257/280 |
| 2011/0284930 A1 | 11/2011 | Hershberger et al. |
| 2012/0292669 A1 | 11/2012 | Candra et al. |

OTHER PUBLICATIONS

McGoldrick P: "High Frequency Processes Remain Locked in the Vault", Electronic Design, Penton Media, Cleveland OH US, vol. 44 No 26, Dec. 16, 1996.

* cited by examiner

METHOD FOR MANUFACTURING AN INTEGRATED CIRCUIT COMPRISING A JUNCTION FIELD EFFECT TRANSISTOR (JFET)

CROSS REFERENCE TO RELATED APPLICATIONS

This application is a divisional of United States Application for patent Ser. No. 17/095,230, filed Nov. 11, 2020, which claims the priority benefit of French Application for Patent No. 1912782, filed on Nov. 15, 2019, the content of which is hereby incorporated by reference in its entirety to the maximum extent allowable by law.

TECHNICAL FIELD

Modes of implementation and embodiments relate to integrated circuits and, in particular, integrated circuits comprising junction field-effect transistors (JFETs), and to the manufacture of such integrated circuits.

BACKGROUND

JFET transistors generally have low electrical noise at output, and generally have a good resistance to high voltages. JFET transistors are found, for example, in high-accuracy and high-input-impedance operational amplifier input stages.

It is known to form a JFET transistor in a semiconductor substrate. The JFET transistor comprises a source region and a drain region that are spaced from one another. The JFET transistor also comprises a channel region extending from the drain region to the source region. The JFET transistor further comprises a gate region extending over the channel region from the drain region to the source region.

The source and drain regions are diffused deeply in the semiconductor substrate through implantation, that is to say more deeply than the channel region of the transistor.

These source and drain regions are diffused deeply in order to support a high voltage, in particular of the order of 40 volts. However, these deeply diffused regions have the drawback of creating stray capacitances between the drain region and the gate region, and between the source region and the gate region.

These stray capacitances reduce the high-frequency performance of JFET transistors and therefore limit the use of JFET transistors to certain applications.

There is therefore a need to be able to provide a JFET transistor having stray capacitances in such a way as to have good high-frequency performance.

SUMMARY

According to one aspect, an integrated circuit comprises: a semiconductor substrate and a junction field-effect transistor formed in the substrate. The junction field-effect transistor comprises: a drain region and a source region that are spaced from one another, a channel region between the drain region and the source region, a gate region between the drain region and the source region, and wherein the substrate comprises: a first isolating region separating the drain region from the gate region and from the channel region, and a second isolating region separating the source region from the gate region and from the channel region, a first connection region connecting the drain region to the channel region while bypassing the first isolating region, and a second connection region connecting the source region to the channel region while bypassing the second isolating region.

The channel region and the gate region therefore extend from a first lateral face of the first isolating region to a first lateral face of the second isolating region.

The channel region and the gate region thus have a first end against the first lateral face of the first isolating region and a second end against the first lateral face of the second isolating region.

The drain region is arranged in contact with a second lateral face of the first isolating region opposite the first lateral face of the first isolating region.

The source region is arranged in contact with a second lateral face of the second isolating region opposite the first lateral face of the second isolating region.

The connection regions make it possible to connect the source region to the first end of the channel region and to connect the drain region to the second end of the channel region.

In particular, isolating the drain and source regions from the gate region and from the channel region makes it possible to reduce the stray capacitances between the drain and source regions and the gate region. This reduction in the stray capacitances makes it possible to support high voltages.

In particular, according to one embodiment, the drain region and the source region are surface-diffused to a depth that makes it possible to reduce stray capacitances.

Thus, according to one embodiment, the source region and the drain region extend downwards from the front face of the substrate to a lower face of the channel region.

Such a JFET transistor therefore comprises a channel region and a drain region that are diffused at the surface of the semiconductor substrate and isolated from the gate region and from the channel region. This structure makes it possible to support high voltages with low stray capacitances.

In particular, isolating the drain and source regions from the gate region and from the channel region also makes it possible not to have to deeply diffuse the drain and source regions. Furthermore, only surface-diffusing the drain region and the source region also makes it possible to reduce stray capacitances. This reduction in the stray capacitances also makes it possible to support high voltages.

Furthermore, each connection region thus extends underneath and counter to the isolating region that it bypasses.

According to one embodiment, the first isolating region and the second isolating region extend into the substrate from the front face of the substrate. In particular, each connection region has: a first part extending vertically into the substrate, in contact with a first lateral face of the corresponding isolating region, from the lower face of the channel region, a second horizontal part extending horizontally into the substrate, in contact with a lower face of the corresponding isolating region, and a third part extending vertically into the substrate, in contact with a second lateral face of the corresponding isolating region, until contacting the corresponding source or drain region.

According to one embodiment, the drain region, the source region, the channel region, the first connection region and the second connection region have a first conductivity type. Furthermore, the gate region has a second conductivity type.

The JFET transistor may thus, for example, have a P-type channel. The drain region, the source region, the channel region, the first connection region and the second connection region then have P-type conductivity. The gate region then has N-type conductivity.

As a variant, the JFET transistor may have an N-type channel. The drain region, the source region, the channel region, the first connection region and the second connection region then have N-type conductivity. The gate region then has P-type conductivity.

The integrated circuit may comprise a plurality of JFET transistors such as those described above.

According to one embodiment, the integrated circuit further comprises at least one bipolar transistor having drift regions of the same conductivity type as that of the connection regions of the JFET transistor.

The integrated circuit may comprise a plurality of JFET transistors comprising connection regions and a plurality of bipolar transistors comprising drift regions.

According to another aspect, a method for manufacturing an integrated circuit comprises forming, in a substrate, a junction field-effect transistor comprising: forming a drain region and a source region that are spaced from one another, forming a channel region between the drain region and the source region, forming a gate region on the channel region between the drain region and the source region, wherein the method further comprises: forming a first isolating region separating the drain region from the gate region and from the channel region, and a second isolating region separating the source region from the gate region and from the channel region, forming a first connection region connecting the drain region to the channel region while bypassing the first isolating region, and a second connection region connecting the source region to the channel region while bypassing the second isolating region.

According to one mode of implementation, forming the first connection region and the second connection region comprises dopant implantation.

According to one mode of implementation, the manufacturing method further comprises forming, in the substrate, at least one bipolar transistor having a base, an emitter and a collector and drift regions having the same conductivity type as that of the connection regions. Forming the first connection region and the second connection region and forming the drift regions is furthermore carried out using the same mask.

According to one mode of implementation, forming the first connection region and forming the second connection region is carried out at the same time as forming the drift region.

Forming the first connection region and forming the second connection region therefore does not require a dedicated additional step. Forming the first connection region and the second connection region is thus inexpensive.

BRIEF DESCRIPTION OF THE DRAWINGS

Other advantages and features of the invention will become apparent on examining the detailed description of completely non-limiting modes of implementation and embodiments and the appended drawings, in which.

DETAILED DESCRIPTION

Figure 1:
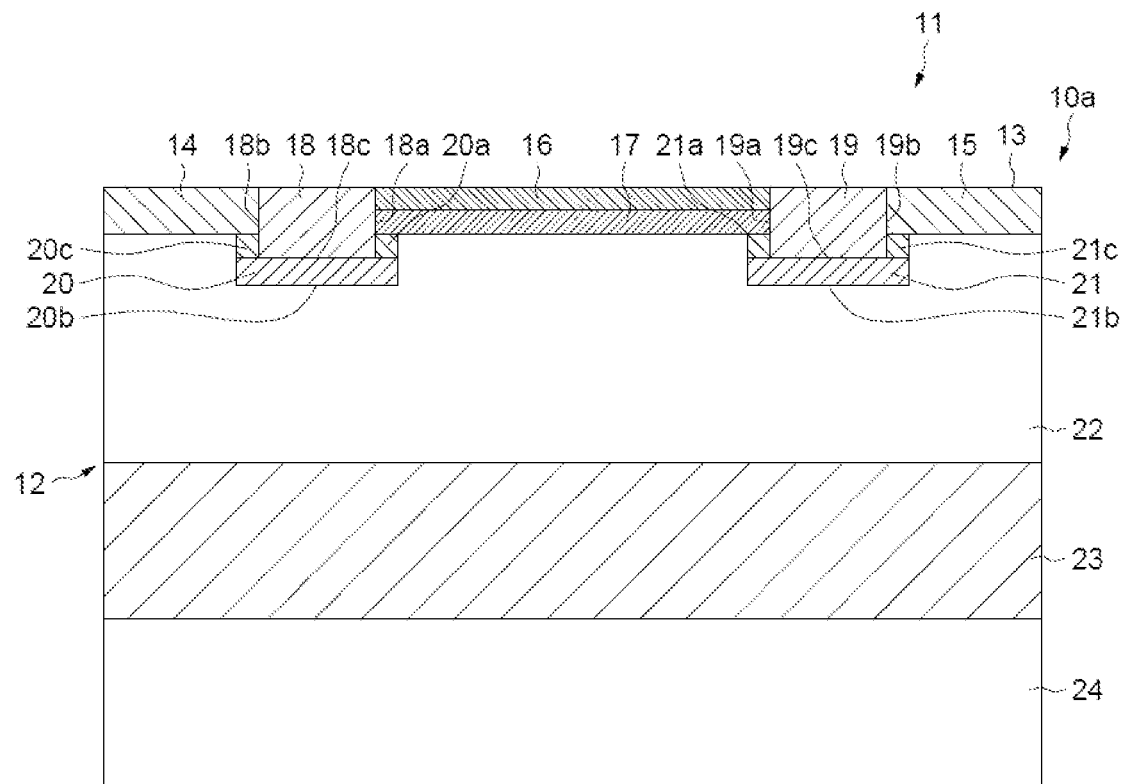
FIG. 1 shows an integrated circuit which comprises a junction field-effect transistor (JFET)

FIG. 1 shows an integrated circuit 10a according to one embodiment, wherein the integrated circuit 10a comprises a junction field-effect transistor, called JFET transistor 11, formed in a semiconductor substrate 12. The semiconductor substrate 12 has a front face 13.

The JFET transistor 11 comprises a drain region 14 and a source region 15 that are spaced from one another. The drain region 14 and the source region 15 have a conductivity of a first type (N or P). In particular, the drain region 14 and the source region 15 each extend downwards from the front face 13 of the semiconductor substrate 12 over a distance of the order of 0.2 µm to 0.3 µm.

The JFET transistor 11 further comprises a gate region 16 between the drain region 14 and the source region 15. The gate region 16 has a conductivity of a second type (P or N) different from the first conductivity type. The gate region 16 extends downwards from the front face 13 of the semiconductor substrate 12 over a distance of the order of 0.2 µm.

The JFET transistor 11 also comprises a channel region 17 between the drain region 14 and the source region 15. The channel region 17 has a conductivity of said first type. The channel region 17 extends downwards from the gate region 16 over a distance of the order of 0.4 µm.

The JFET transistor 11 further comprises, within the substrate 12, a first isolating region 18 separating the drain region 14 from both the gate region 16 and the channel region 17. The first isolating region 18 extends to a depth that is below a bottom of the drain region 14 and channel region 17.

The JFET transistor 11 also comprises, within the substrate 12, a second isolating region 19 separating the source region 15 from both the gate region 16 and the channel region 17. The second isolating region 19 extends to a depth that is below a bottom of the source region 15 and channel region 17.

In particular, the first isolating region 18 and the second isolating region 19 each extend downwards from the front face 13 of the semiconductor substrate 12 over a distance of the order of 1 µm, and thus each region 18, 19 has a depth in the substrate below bottoms of the regions 14, 15 and 17.

The first isolating region 18 and the second isolating region 19 may, for example, comprise silicon dioxide.

More particularly, the channel region 17 and the gate region 16 extend from a first lateral face 18a of the first isolating region 18 to a first lateral face 19a of the second isolating region 19.

The channel region 17 and the gate region 16 thus each have a first longitudinal end against (e.g., in contact with) the first lateral face 18a of the first isolating region 18 and a second longitudinal end against (e.g., in contact with) the first lateral face 19a of the second isolating region 19.

Furthermore, the drain region 14 is arranged against (e.g. in contact with) a second lateral face (side) 18b of the first isolating region 18 opposite the first lateral face 18a of the first isolating region 18.

The source region 15 is arranged against (e.g., in contact with) a second lateral face (side) 19b of the second isolating region 19 opposite the first lateral face 19a of the second isolating region 19.

The JFET transistor 11 also comprises, within the substrate 12, a first connection region 20 connecting the drain region 14 to the channel region 17 while bypassing (e.g., passing along the lateral faces and underneath) the first isolating region 18.

In particular, the first connection region 20 comprises a first part 20a extending vertically into the substrate 12, in contact with said first lateral face 18a of the first isolating region 18, from the channel region 17.

The first connection region 20 comprises a second horizontal part 20b extending horizontally into the substrate 12, in contact with a lower face 18c of the first isolating region 18.

The first connection region 20 also comprises a third part 20c extending vertically into the substrate 12, in contact with the second lateral face 18b of the first isolating region 18, until contacting the drain region 14.

The JFET transistor 11 also comprises, within the substrate 12, a second connection region 21 connecting the source region 15 to the channel region 17 while bypassing (e.g., passing along the lateral faces and underneath) the second isolating region 19.

In particular, the second connection region 21 comprises a first part 21a extending vertically into the substrate 12, in contact with said first lateral face 19a of the second isolating region 19, from the channel region 17.

The second connection region 21 comprises a second horizontal part 21b extending horizontally into the substrate 12, in contact with a lower face of the second isolating region 19.

The second connection region 21 also comprises a third part 21c extending vertically into the substrate 12, in contact with the second lateral face 19b of the second isolating region 19, until contacting the source region 15.

The first connection region 20 makes it possible to connect the drain region 14 to the channel region 17. The second connection region 21 makes it possible to connect the source region 15 to the channel region 17.

The JFET transistor 11 is formed here in an $N^-$-doped well 22, on top of an $N^+$-doped buried layer 23 that is itself situated above a $P^-$-doped carrier substrate 24.

The JFET transistor 11 in this case has a P-type channel. The drain region 14, the source region 15, the channel region 17, the first connection region 20, the second connection region 21 and the carrier substrate 24 of the semiconductor substrate 12 then have P-type conductivity. Furthermore, the gate region 16, the well 22 and the buried layer 23 have N-type conductivity.

In particular, the drain region 14 and the source region 15 have a dopant concentration of the order of $5 \times 10^{19}$ atoms/$cm^3$ to $2 \times 10^{20}$ atoms/$cm^3$.

The channel region 17 has a dopant concentration of the order of $10^{16}$ atoms/$cm^3$.

The gate region 16 has a dopant concentration of the order of $10^{17}$ atoms/$cm^3$.

The first connection region 20 and the second connection region 21 have a dopant concentration of the order of $10^{17}$ atoms/$cm^3$.

The well 22 has a dopant concentration of the order of $10^{15}$ atoms/$cm^3$.

The buried layer 23 has a dopant concentration of the order of $10^{19}$ atoms/$cm^3$ to $2 \times 10^{19}$ atoms/$cm^3$.

The carrier substrate 24 has a dopant concentration of the order of $10^{19}$ atoms/$cm^3$ to $2 \times 10^{19}$ atoms/$cm^3$.

As a variant, the JFET transistor 11 may have an N-type channel. The drain region 14, the source region 15, the channel region 17, the first connection region 20, the second connection region 21 and the carrier substrate then have N-type conductivity. Furthermore, the gate region 16, the well 22 and the buried layer have P-type conductivity.

Isolating the drain and source regions from the gate region 16 and from the channel region 17 using regions 18 and 19 makes it possible to reduce the stray capacitances between the drain and source regions and the gate region 16. Only surface-diffusing the drain region 14 and the source region 15 also makes it possible to reduce stray capacitances. This reduction in the stray capacitances makes it possible to support high voltages. For example, such a JFET transistor 11 makes it possible to achieve breakdown voltages of the order of 80 volts.

Figure 2:
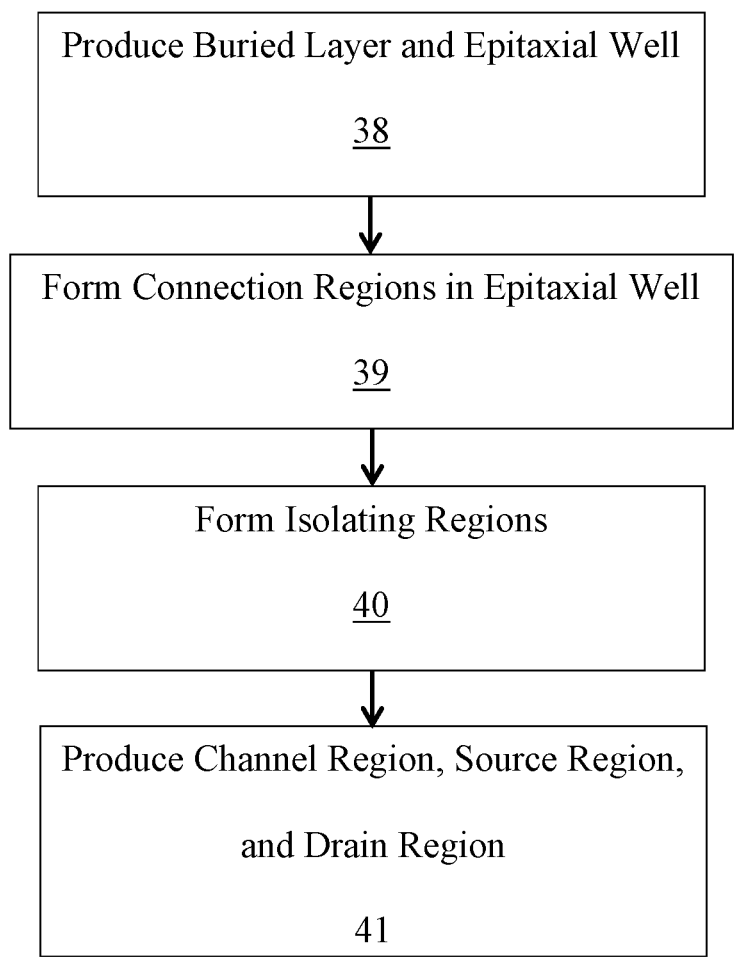
FIG. 2 shows a method for manufacturing an integrated circuit such as the one shown in FIG. 1.

FIG. 2 shows an example of a method for manufacturing an integrated circuit such as the one shown in FIG. 1. In a step 38, the buried layer 23 is produced through dopant implantation into the carrier substrate 24, and then the well 22 is produced through epitaxy.

In step 39, the connection regions 20 and 21 are formed by masking and dopant implantation into the well 22.

The isolating regions 18 and 19 are then formed in step 40, before producing the channel region 17 and producing the drain and source regions 18 and 19 through dopant implantation in step 41.

Figure 3:
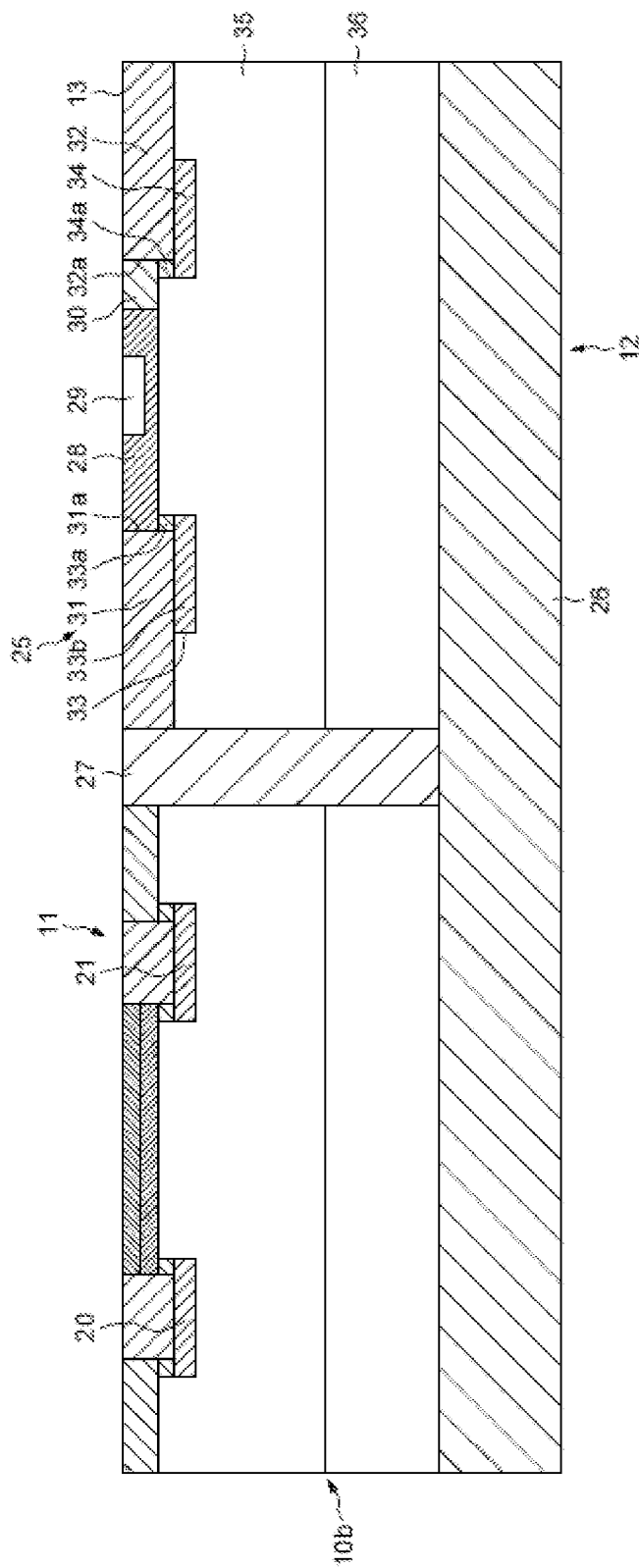
FIG. 3 shows an integrated circuit comprising a JFET transistor and a bipolar transistor.

FIG. 3 shows an integrated circuit 10b according to one embodiment of the invention comprising a JFET transistor 11 as described above and a bipolar transistor 25.

The JFET transistor 11 and the bipolar transistor 25 are formed using the same carrier substrate 26.

The JFET transistor 11 is separated from the bipolar transistor 25 by a shallow trench isolation (STI) 27.

The bipolar transistor 25 is in this case an NPN transistor. As is conventional, it has an intrinsic collector region formed in the well 35, an intrinsic base region 28, an extrinsic base region 30 and an emitter region 29. The bipolar transistor 25 also has drift regions 33 and 34 situated underneath isolation regions 31 and 32, respectively, and contacting the intrinsic base region and the extrinsic base region.

The drift regions 33 and 34 are of the same conductivity type as that of the connection regions 20, 21 of the JFET transistor 11.

As a variant or in combination, the integrated circuit 10b may comprise a JFET transistor 11 with an N-type channel and a PNP bipolar transistor 25.

The method for manufacturing an integrated circuit such as the one shown in FIG. 3 comprises forming a JFET transistor 11 as described above.

The manufacturing method further comprises conventionally forming the bipolar transistor 25.

Figure 4:
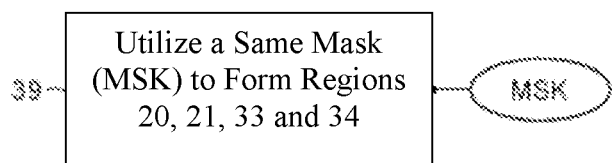
FIG. 4 shows a method for manufacturing an integrated circuit such as the one shown in FIG. 3.

Moreover, as illustrated in FIG. 4, forming the first connection region 20 and the second connection region 21 and forming the drift regions 33, 34 is carried out in step 39 using the same mask MSK. Furthermore, in this step 39, forming the first connection region 20 and forming the second connection region 21 is advantageously carried out at the same time as forming the drift regions.

Forming the first connection region 20 and forming the second connection region 21 therefore does not require a dedicated additional step. Forming the first connection region 20 and the second connection region 21 is therefore inexpensive.

The invention claimed is:

1. A method for manufacturing an integrated circuit, comprising:
    manufacturing a junction field-effect transistor in a semiconductor substrate by:

within the semiconductor substrate: forming a drain region and a source region that are spaced from one another and forming a channel region between the drain region and the source region;

forming a gate region on the channel region between the drain region and the source region;

forming a first isolating region having a depth that is deeper than a bottom of the drain region and deeper than a bottom of the channel region, said first isolating region separating the drain region from both the gate region and the channel region;

forming a second isolating region having a depth that is deeper than a bottom of the source region and deeper than the bottom of the channel region, said second isolating region separating the source region from both the gate region and the channel region;

forming a first connection region extending along lateral faces and a bottom of the first isolating region to connect the drain region to the channel region; and forming a second connection region extending along lateral faces and a bottom of the second isolating region to connect the source region to the channel region wherein a doping process for forming the first and second connection regions is separate from a doping process for forming the channel region.

2. The method according to claim 1, wherein the doping process for forming the first and second connection regions comprises performing a dopant implantation.

3. The method according to claim 2, further comprising manufacturing, in the semiconductor substrate, a bipolar transistor having a base, an emitter and a collector and drift regions, wherein said drift regions have a conductivity type that is same as a conductivity type of the first and second connection regions.

4. The method according to claim 3, wherein forming the first connection region and forming the second connection region and forming the drift regions is carried out using a same mask.

5. The method according to claim 4, wherein forming the first connection region and forming the second connection region is carried out at a same time as forming the drift region.

6. The method according to claim 3, wherein manufacturing the bipolar transistor comprises:

forming the base between third and fourth isolating regions in the semiconductor substrate;

wherein the third and fourth isolating regions have a depth deeper than a bottom of the base; and wherein said drift regions extend along lateral faces and a bottom of the third and fourth isolating regions.

7. The method according to claim 6, further comprising forming a first part of each drift region in contact with a first lateral face of a corresponding one of the third and fourth isolating regions and extending into the semiconductor substrate from a lower face of the base.

8. The method according to claim 6, further comprising forming a second part of each drift region in contact with a lower face of a corresponding one of the third and fourth isolating regions and extending horizontally within the semiconductor substrate.

9. The method according to claim 1, wherein said first connection region has a dopant concentration less than a dopant concentration of the drain region and greater than a dopant concentration of the channel region.

10. The method according to claim 1, wherein said second connection region has a dopant concentration less than a dopant concentration of the source region and greater than a dopant concentration of the channel region.

11. A method for manufacturing an integrated circuit, comprising:

manufacturing a junction field-effect transistor in a semiconductor substrate by:

within the semiconductor substrate: forming a drain region and a source region that are spaced from one another and forming a channel region between the drain region and the source region;

forming a gate region on the channel region between the drain region and the source region;

forming a first isolating region separating the drain region from both the gate region and the channel region;

forming a second isolating region separating the source region from both the gate region and the channel region;

forming a first connection region that connects the drain region to the channel region and bypasses the first isolating region, wherein said first connection region has a dopant concentration less than the drain region and greater than the channel region; and forming a second connection region that connects the source region to the channel region and bypasses the second isolating region, wherein said second connection region has a dopant concentration less than the source region and greater than the channel region.

12. The method according to claim 11, wherein forming the first connection region comprises performing a dopant implantation.

13. The method according to claim 12, wherein said dopant implantation extends along lateral faces and a bottom of the first isolating region.

14. The method according to claim 11, wherein forming the second connection region comprises performing a dopant implantation.

15. The method according to claim 14, wherein said dopant implantation extends along lateral faces and a bottom of the second isolating region.

16. The method according to claim 11, wherein said first isolating region has a depth that is deeper than a bottom of the drain region and deeper than a bottom of the channel region.

17. The method according to claim 11, wherein said second isolating region has a depth that is deeper than a bottom of the source region and deeper than the bottom of the channel region.

18. The method according to claim 11, further comprising manufacturing, in the semiconductor substrate, a bipolar transistor having a base, an emitter and a collector and drift regions, wherein said drift regions have a conductivity type that is same as a conductivity type of the first and second connection regions.

19. The method according to claim 18, wherein forming the first connection region and forming the second connection region and forming the drift regions is carried out using a dopant implantation through a same mask.

20. The method according to claim 18, wherein forming the first connection region and forming the second connection region is carried out at a same time as forming the drift region.

* * * * *